US006914271B2

(12) United States Patent
Menard

(10) Patent No.: US 6,914,271 B2
(45) Date of Patent: Jul. 5, 2005

(54) HIGH-VOLTAGE BIDIRECTIONAL SWITCH

(75) Inventor: Samuel Menard, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/744,412

(22) Filed: Dec. 23, 2003

(65) Prior Publication Data

US 2004/0135170 A1 Jul. 15, 2004

(30) Foreign Application Priority Data

Dec. 27, 2002 (FR) .............................. 02 16807

(51) Int. Cl.[7] ..................... H01L 29/74; H01L 31/111
(52) U.S. Cl. ................. 257/119; 257/123; 257/E29.215
(58) Field of Search ............................... 257/119, 123, 257/E29.215

(56) References Cited

U.S. PATENT DOCUMENTS

| 5,757,033 A | * | 5/1998 | Ajit ............................ 257/120 |
| 2003/0001169 A1 | | 1/2003 | Simonnet |
| 2004/0026711 A1 | | 2/2004 | Gimonet |

FOREIGN PATENT DOCUMENTS

EP 0635889 A1 1/1995

OTHER PUBLICATIONS

French Search Report from corresponding French Application No. 02/16807, filed Dec. 27, 2002.

* cited by examiner

*Primary Examiner*—David Nelms
*Assistant Examiner*—Tu-Tu Ho
(74) *Attorney, Agent, or Firm*—Lisa K. Jorgenson; James H. Morris; Wolf, Greenfield & Sacks, P.C.

(57) ABSTRACT

A bidirectional switch for switching an A.C. voltage at a load, including a monolithic component, formed in an N-type substrate, including a first vertical thyristor; a second vertical thyristor; a P-type triggering region formed opposite to the cathode of the first thyristor and an N-type triggering region formed in the P-type triggering region, the P-type triggering region being intended to receive a control signal in a negative halfwave of the A.C. voltage to trigger the first thyristor; a resistive element connected to the P-type triggering region and to the anode of the first thyristor; and a capacitor having a terminal connected to the N-type triggering region and its other terminal intended to be connected to the reference voltage.

22 Claims, 2 Drawing Sheets

US 6,914,271 B2

HIGH-VOLTAGE BIDIRECTIONAL SWITCH

BACKGROUND OF THE INVENTION

1. Field of the Invention

The present invention relates to the field of high-voltage bidirectional switches. The present invention more specifically relates to a bidirectional switch intended to be series-connected with a load, the assembly being supplied by a high A.C. voltage, for example, the mains.

2. Discussion of the Related Art

High-voltage switches for an A.C. load of the type to which the present invention relates are used, in particular, to control household appliances, for example, washing machines, in which one or several A.C.-supplied loads (motors, pumps, heating resistors, valves) must be controlled from the machine microcontroller.

A bidirectional switch capable of being controlled by a low-voltage signal may be formed of a triac, the gate of which receives a low-voltage control signal.

A triac must be turned on at each halfwave of the supply voltage since it turns off when the current between its two power terminals disappears.

Some switches comprise a triac control circuit which enables, when the triac is turned on by a control signal during a halfwave, maintaining it on until the end of the next halfwave.

A disadvantage of such switches is that the control circuit is generally complex and expensive to form. Further, such a circuit may require use of one or several high-voltage capacitors, which components are difficult to form and are relatively expensive.

SUMMARY OF THE INVENTION

The present invention aims at providing a bidirectional switch that can be triggered by a low-voltage control signal during a halfwave of the supply voltage and remain on until the end of the next halfwave of the supply voltage, which is simple and inexpensive to form.

The present invention especially aims at providing a bidirectional switch which does not use a high-voltage capacitor.

To achieve this and other objects, the present invention provides a bidirectional switch for switching an A.C. voltage at a load, comprising a monolithic component, formed in an N-type substrate, comprising:

a first vertical thyristor comprising, from top to bottom, a first P-type region, the N-type substrate, a second P-type region, and a first N-type region contained in the second P-type region;

a second vertical thyristor comprising, from bottom to top, the second P-type region, the N-type substrate, the first P-type region, and a second N-type region contained in the first P-type region;

a P-type triggering region formed on the high substrate side opposite to the cathode of the first thyristor and an N-type triggering region formed in the P-type triggering region;

the cathode of the first thyristor and the anode of the second thyristor being intended to be connected to a terminal of the load, the anode of the first thyristor and the cathode of the second thyristor being intended to be connected to a reference voltage, and the P-type triggering region being intended to receive at least one control signal in a negative halfwave of the A.C. voltage to trigger the first thyristor;

a resistive element connected to the P-type triggering region and to the anode of the first thyristor; and a capacitor having a terminal connected to the N-type triggering region and its other terminal intended to be connected to the reference voltage.

According to an embodiment of the present invention, the substrate comprises a P-type protection region surrounding the P-type triggering region and more lightly doped than the P-type triggering region, the minimum distance separating the protection region from the anode of the first thyristor being smaller than a determined distance.

According to an embodiment of the present invention, the protection region is in contact with the anode of the first thyristor.

According to an embodiment of the present invention, the capacitor is a low-voltage capacitor.

According to an embodiment of the present invention, the resistive element is integrated to the substrate.

The present invention also provides a monolithic switching device for a switch of an A.C. voltage at a load, said switching device, formed in an N-type substrate, comprising:

a first vertical thyristor comprising, from top to bottom, a first P-type region, the N-type substrate, a second P-type region, and a first N-type region contained in the second P-type region;

a second vertical thyristor comprising, from bottom to top, the second P-type region, the N-type substrate, the first P-type region, and a second N-type region contained in the first P-type region;

a P-type triggering region formed on the upper side of the substrate opposite to the cathode of the first thyristor and an N-type triggering region formed in the P-type triggering region;

the cathode of the first thyristor and the anode of the second thyristor being intended to be connected to a terminal of the load, the anode of the first thyristor and the cathode of the second thyristor being intended to be connected to a reference voltage, and the P-type triggering region being intended to be connected to the anode of the first thyristor via a resistive element and to receive at least one control signal in a negative halfwave of the A.C. voltage to trigger the first thyristor, and the N-type triggering region being intended to be connected to a terminal of a capacitor having its other terminal connected to the reference voltage.

The foregoing objects, features, and advantages of the present invention will be discussed in detail in the following non-limiting description of specific embodiments in connection with the accompanying drawings.

DETAILED DESCRIPTION

For clarity, only those elements that are necessary to the understanding of the present invention have been shown and will be described hereafter.

Figure 1:
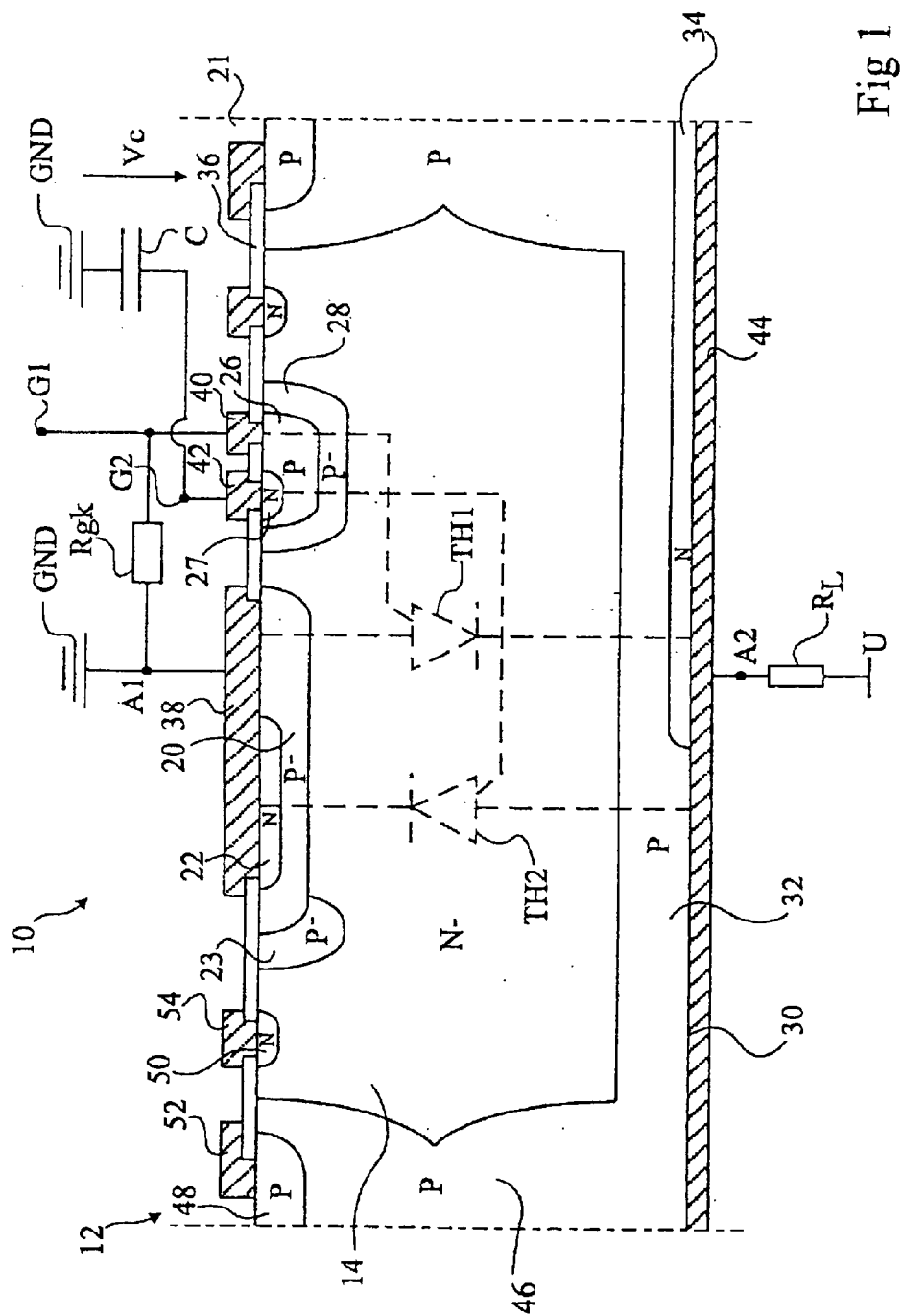
FIG. 1 schematically shows an example of embodiment of a high-voltage bidirectional switch according to the present invention, a portion of the switch being represented by a monolithic component in cross-section view, the other portion being represented by an electric circuit.

FIG. 1 shows a bidirectional switch 10 according to the present invention comprising a bidirectional switching device 12 made in monolithic form which is formed of two vertical power thyristors TH1, TH2 arranged in antiparallel between two power terminals A1 and A2. The two thyristors TH1, TH2 are shown in dotted lines.

Switching device 12 is made in a substrate 14, for example made of lightly-doped N-type silicon. An anode region 20 of first thyristor TH1 is formed on upper surface side 21 of substrate 14. Region 20 contains an N-type cathode region 22 of second thyristor TH2, more heavily doped than substrate 14. A P-type protection region 23 more lightly-doped than region 20 at least partially surrounds region 20. Protection region 23 conventionally enables modifying the distribution of the equipotential surfaces in substrate 14 to increase the breakdown voltage of switching device 12.

Substrate 14 contains, on the side of its upper surface 21, a first P-type triggering region 26 of first thyristor TH1, in the vicinity of P-type region 20. Triggering region 26 contains a second N-type triggering region 27, more heavily doped than substrate 14. A P-type protection region 28 more lightly doped than triggering region 25 surrounds triggering region 25. The minimum distance separating protection region 28 from region 20 is smaller than a determined minimum distance to ensure a proper distribution of the equipotential surfaces in substrate 14. In particular, protection region 28 may extend to region 20.

Substrate 14 comprises, on its lower surface side 30, a P-type anode region 32 of second thyristor TH2. An N-type cathode region 34 of first thyristor TH1, more heavily doped than substrate 14, extends into region 32 substantially opposite to the portion of region 20 which does not contain cathode region 22 and also opposite to triggering region 26.

An insulating layer 36 covers upper surface 21 of substrate 14. A metal electrode 38 is in contact with anode region 20 of first thyristor TH1 and cathode region 22 of second thyristor TH2. Electrode 38 forms power terminal A1 common to the two power thyristors TH1, TH2.

A metal electrode 40 is in contact with triggering region 26 and forms a first gate terminal G1. A metal electrode 42 is in contact with triggering region 27 and forms a second gate terminal G2.

A metal electrode 44 covers lower surface 30 of substrate 14 and is in contact with anode region 32 of second thyristor TH2 and cathode region 34 of first thyristor TH1. Electrode 44 forms the second power terminal A2 common to the two thyristors TH1, TH2.

Substrate 14 may comprise on its periphery a P-type protection wall 46. Protection wall 46 preferably comprises on the upper surface side 21 of substrate 14 a P-type ring-shaped region 48 more heavily doped than wall 46.

An N-type ring-shaped channel stop region 50, more heavily-doped than substrate 14, may be provided on the upper surface side 21 around region 20 and triggering region 26. Region 50 enables avoiding the development of possible short-circuits between region 20 and protection wall 46.

Optional metal rings 52, 54, extend on the upper surface side 21 of substrate 14 and are respectively in contact with P-type ring-shaped region 48 and channel stop region 50 to improve the voltage equalization in these regions.

Power terminal A1 is connected to a reference voltage of an A.C. power supply, for example, ground GND. First gate terminal G1 is connected to power terminal A1 by a resistor $R_{gk}$. Second gate terminal G2 is connected to a terminal of a capacitor C having its other terminal connected to reference voltage GND.

Power terminal A2 is connected to a first terminal of a load $R_L$ to be switched. An A.C. supply voltage U is applied between the second terminal of load $R_L$ and power terminal A1.

Figure 2:
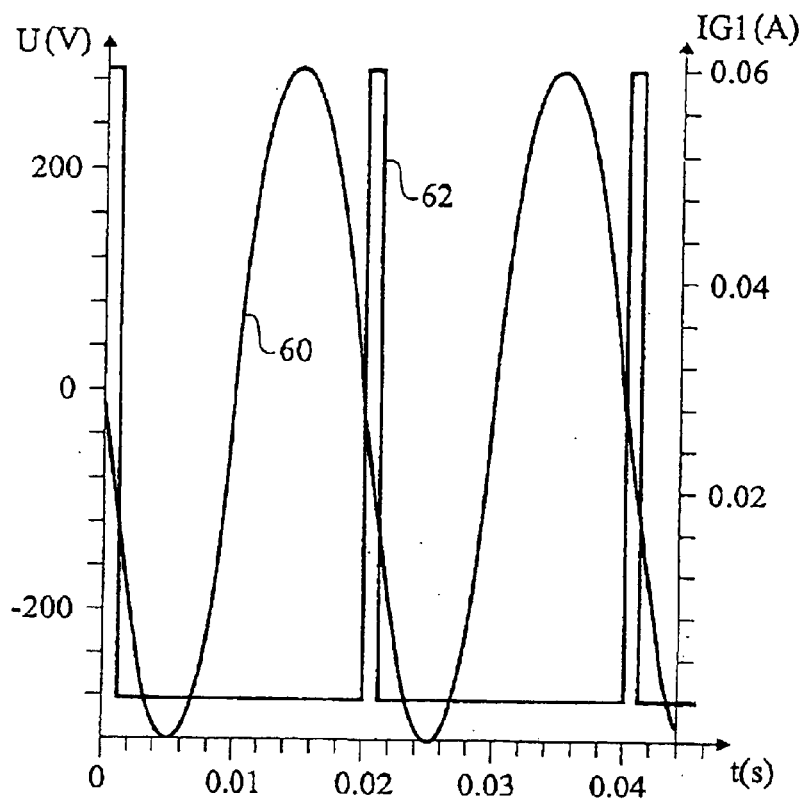
FIGS. 2 and 3 illustrate in the form of timing diagrams the operation of the switch of FIG. 1.

In FIG. 2, curve 60 represents A.C. voltage U. It is for example the mains voltage corresponding to a sinusoidal A.C. voltage of a 50-Hz frequency and of an amplitude of several hundreds of volts.

According to the present invention, current pulses are applied on first gate terminal G1. The pulses are shown in FIG. 2 by curve 62 superposed to curve 60 and the scale of which appears to the right of the drawing. A positive current pulse is applied to first gate terminal G1 at the beginning of each negative halfwave of supply voltage U to cause the triggering of thyristor TH1. Thyristor TH2 then automatically triggers at the next positive halfwave.

The operating principle of the device according to the present invention more specifically is the following.

On a negative halfwave of voltage U, a positive current pulse is injected onto gate terminal G1. The current runs through resistor $R_{gk}$. As a result, the potential on gate terminal G1 increases and the diode formed by the junction between triggering regions 26, 27 turns on. Carriers are then injected into the substrate and cause the triggering of thyristor TH1, which is biased to be able to be on.

During the negative halfwave, as long as thyristor TH1 is on, the device region corresponding to the junction between triggering regions 26, 27, which is close to the anode region of thyristor TH1, is saturated in terms of free carriers. This junction is then conductive and negative charges accumulate on the electrode of capacitor C not connected to ground. Capacitor C thus charges negatively during the negative halfwave.

Figure 3:
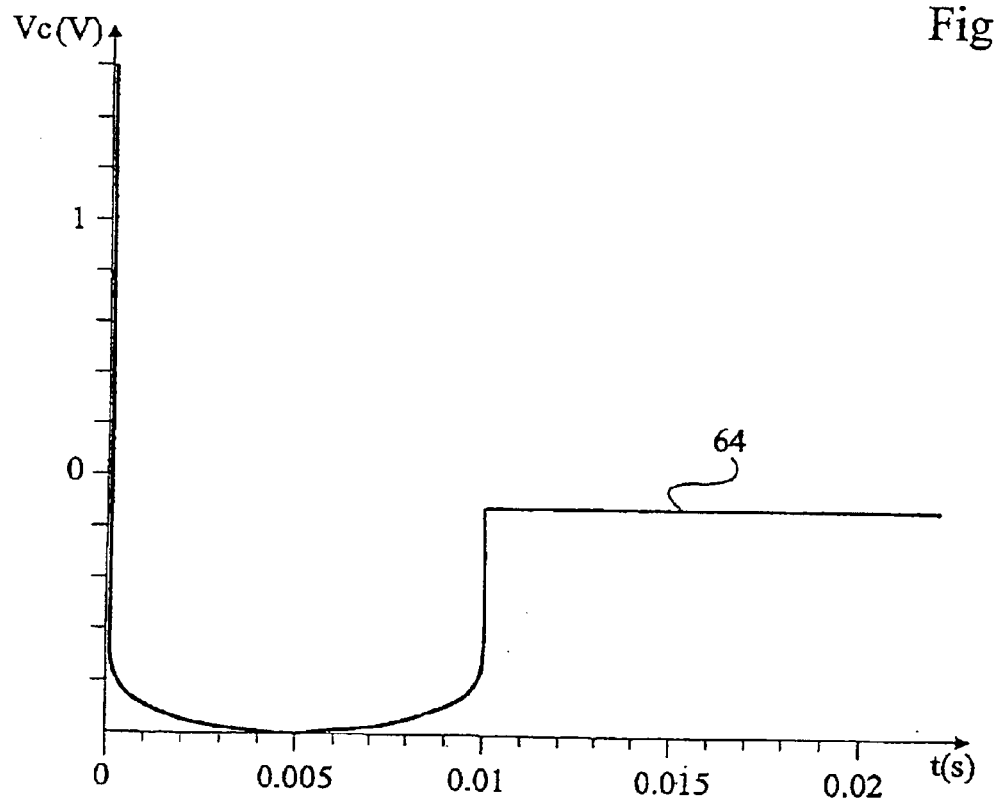

FIG. 3 shows curve 64 of variation of voltage $V_C$ across capacitor C for a single period of supply voltage U. Capacitor C is initially discharged. The capacitance of capacitor C is chosen so that once completely charged, the capacitor exhibits between its terminals a negative voltage $V_C$ greater in absolute value than 0.6 volt.

At the end of the first negative halfwave, when the current running through first thyristor TH1 decreases below a threshold level, first thyristor TH1 turns off. Capacitor C triggers discharging and a negative current flows to ground through the diode formed between triggering regions 26, 27 and through resistor $R_{gk}$. This diode is conductive since the voltage across capacitor C is greater than 0.6 volt in absolute value.

When the next positive halfwave of supply voltage U triggers, the potential of lower surface electrode 44 becomes positive. First, a negative current continues to flow from capacitor C to ground through the diode formed between triggering regions 26, 27 and through resistor $R_{gk}$. The junction between triggering region 26 and substrate 14, close to the diode formed between triggering regions 26, 27, is then saturated in terms of free carriers. This junction is conductive and enables triggering of an oblique thyristor formed by second triggering region 27, first triggering region 26, substrate 14, and anode region 32. Capacitor C then completes its discharge via the oblique thyristor. The latter then causes the triggering of power thyristor TH2.

Resistance $R_{gk}$ must be sufficiently large to avoid too significant a discharge of capacitor C into resistor $R_{gk}$ at the end of the negative halfwave, and sufficiently small for switching device 12 not to be too sensitive to parasitic triggerings resulting from abrupt variations in the voltage thereacross (so-called dV/dt triggerings).

At the end of the positive halfwave, when the current running through thyristor TH2 decreases below a threshold current, switching device 12 turns off. A current pulse must then be applied again on gate terminal G1 at the next negative halfwave to cause the conduction of switching device 12 on the next period of voltage U.

The control method of the present invention enables setting the power provided to load $R_L$ by modifying the time when the current pulse is applied on first gate terminal G1 during a negative halfwave.

As an example, resistor $R_{gk}$ may be of a few hundreds of ohms, for example, 300 ohms, and the capacitance of capacitor C may be of a few hundreds of nanofarads, for example, 500 nanofarads.

According to an alternative of the present invention, resistor $R_{gk}$ connecting gate terminal G1 to power terminal A1 may be directly integrated to switching device 12 and be formed by a portion of P⁻ protection region 28 contacting anode region 20.

The present invention has many advantages:

First, the switch according to the present invention is mainly formed of a switching device made in monolithic form, of a capacitor, and of a resistor (possibly integrated to the switching device). It thus has a particularly simple structure. Further, the switch components may be formed at low cost by conventional technologies.

Second, the voltages across the capacitor remain low, at most of a few volts, during the operation of the switch according to the present invention. A low-voltage capacitor which can easily be formed with a great reliability may then be selected.

Third, untimely triggerings of the switching device which may occur when the supply voltage abruptly varies may be avoided by setting the value of resistance $R_{gk}$.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional switch for switching an A.C. voltage at a load, comprising:
    a monolithic component, formed in an N-type substrate, comprising:
    a first vertical thyristor comprising, from top to bottom, a first P-type region, the N-type substrate, a second P-type region, and a first N-type region contained in the second P-type region;
    a second vertical thyristor comprising, from bottom to top, the second P-type region, the N-type substrate, the first P-type region, and a second N-type region contained in the first P-type region;
    a P-type triggering region formed on the high substrate side opposite to the cathode of the first thyristor and an N-type triggering region formed in the P-type triggering region;
    the cathode of the first thyristor and the anode of the second thyristor being intended to be connected to a terminal of the load, the anode of the first thyristor and the cathode of the second thyristor being intended to be connected to a reference voltage, and the P-type triggering region being intended to receive at least one control signal in a negative halfwave of the A.C. voltage to trigger the first thyristor;
    a resistive element connected to the P-type triggering region and to the anode of the first thyristor; and
    a capacitor having a terminal connected to the N-type triggering region and its other terminal intended to be connected to the reference voltage.

2. The switch of claim 1, wherein the substrate comprises a P-type protection region surrounding the P-type triggering region and more lightly doped than the P-type triggering region, the minimum distance separating the protection region from the anode of the first thyristor being smaller than a determined distance.

3. The switch of claim 2, wherein the protection region is in contact with the anode of the first thyristor.

4. The switch of claim 1, wherein the capacitor is a low-voltage capacitor.

5. The switch of claim 1, wherein the resistive element is integrated to the substrate.

6. A monolithic switching device for a switch of an A.C. voltage at a load, said switching device, formed in an N-type substrate, comprising:
    a first vertical thyristor comprising, from top to bottom, a first P-type region, the N-type substrate, a second P-type region, and a first N-type region contained in the second P-type region;
    a second vertical thyristor comprising, from bottom to top, the second P-type region, the N-type substrate, the first P-type region, and a second N-type region contained in the first P-type region;
    a P-type triggering region formed on the upper side of the substrate opposite to the cathode of the first thyristor and an N-type triggering region formed in the P-type triggering region;
    the cathode of the first thyristor and the anode of the second thyristor being intended to be connected to a terminal of the load, the anode of the first thyristor and the cathode of the second thyristor being intended to be connected to a reference voltage, and the P-type triggering region being intended to be connected to the anode of the first thyristor via a resistive element and to receive at least one control signal in a negative halfwave of the A.C. voltage to trigger the first thyristor, and the N-type triggering region being intended to be connected to a terminal of a capacitor having its other terminal connected to the reference voltage.

7. The switching device of claim 6, wherein the substrate comprises a P-type protection region surrounding the P-type triggering region and more lightly doped than the P-type triggering region, the minimum distance separating the protection region from the anode of the first thyristor being shorter than a determined distance.

8. The switching device of claim 7, wherein the protection region is in contact with the anode of the first thyristor.

9. The switching device of claim 6, wherein the resistive element is integrated in the substrate.

10. A bidirectional switch comprising:
    a monolithic component, formed in a substrate having a first conductivity type, comprising:
    a first vertical thyristor comprising, from top to bottom, a first region having a second conductivity type, the substrate, a second region having the second conductivity type, and a first region having the first conductivity type contained in the second region;

a second vertical thyristor comprising, from bottom to top, the second region, the substrate, the first region, and a second region having the first conductivity type contained in the first region;

a first triggering region having the second conductivity type formed on the high substrate side opposite to the cathode of the first thyristor and a second triggering region having the first conductivity type formed in the first triggering region;

the cathode of the first thyristor and the anode of the second thyristor for connection to a terminal of a load, the anode of the first thyristor and the cathode of the second thyristor for connection to a reference voltage, and the first triggering region for receiving at least one control signal in a negative halfwave of an A.C. voltage to trigger the first thyristor;

a resistive connected to the first triggering region and to the anode of the first thyristor; and a capacitor having a terminal connected to the second triggering region and its other terminal for connection to the reference voltage.

11. The switch of claim 10, wherein the substrate comprises a protection region surrounding the first triggering region and more lightly doped than the first triggering region, a minimum distance separating the protection region from the anode of the first thyristor being less than a determined distance.

12. The switch of claim 11, wherein the protection region is in contact with the anode of the first thyristor.

13. The switch of claim 10, wherein the capacitor is a low-voltage capacitor.

14. The switch of claim 10, wherein the resistive element is integrated in the substrate.

15. The switch of claim 10, wherein the first conductivity type is N-type.

16. The switch of claim 15, wherein the second conductivity type is P-type.

17. A monolithic switching device formed in a substrate having a first conductivity type, comprising:

a first vertical thyristor comprising, from top to bottom, a first region having a second conductivity type, the substance, a second region having the second conductivity type region, and a first region having the first conductivity type contained in the second region;

a second vertical thyristor comprising, from bottom to top, the second region, the substrate, the first region, and a second region having the first conductivity type contained in the first type region;

a first triggering region having the second conductivity type formed on the upper side of the substrate opposite to the canode of the first thyristor and a second triggering region having the first conductivity type formed in the first triggering region;

the cathode of the first thyristor and the anode of the second thyristor for connection to a terminal of the load, the anode of the first thyristor and the cathod of the second thyristor for connection to a reference voltage, and the first triggering region for connection to the anode of the first thyristor via a resistive element and for receiving at least one control signal in a negative halfwave of an A.C. voltage to trigger the first thyristor, and second triggering region for connection to a terminal of a capacitor having another terminal for connection to the reference voltage.

18. The switching device of claim 17, wherein the substrate comprises a first protection region surrounding the first triggering region and more lightly doped than the first triggering region, a minimun distance separating the protection region from the anode of the first thyristor being less than a determined distance.

19. The switching device of claim 18, wherein the protection region is in contact with the anode of the first thyristor.

20. The switching device of claim 17, wherein the resistive element is integrated in the substrate.

21. The switch device of claim 17, wherein the first conductivity type is N- type.

22. The switch device of claim 21, wherein the second conductivity type is P- type.

* * * * *

UNITED STATES PATENT AND TRADEMARK OFFICE
CERTIFICATE OF CORRECTION

PATENT NO. : 6,914,271 B2
DATED : July 5, 2005
INVENTOR(S) : Samuel Menard

It is certified that error appears in the above-identified patent and that said Letters Patent is hereby corrected as shown below:

Column 6,
Line 55, should read:
-- less than a determined distance. --.

Column 7,
Line 17, should read:
-- a resistive element connected to the first triggering region and to --.

Column 8,
Line 1, should read:
-- substrate, a second region having the second conduc- --.
Line 10, should read:
-- to the cathode of the first thyristor a second trig- --.
Line 15, should read:
-- load, the anode of the first thyristor and the cathode of- --.

Signed and Sealed this

Thirtieth Day of August, 2005

JON W. DUDAS
*Director of the United States Patent and Trademark Office*